United States Patent [19]

Nelson

[11] 4,218,214
[45] Aug. 19, 1980

[54] GUIDE WING FOR A FURNACE PADDLE

[75] Inventor: Howard T. Nelson, Findlay, Ohio

[73] Assignee: RCA Corporation, New York, N.Y.

[21] Appl. No.: 9,351

[22] Filed: Feb. 5, 1979

[51] Int. Cl.³ .............................................. F27D 5/00
[52] U.S. Cl. .................................. 432/258; 432/241; 432/261
[58] Field of Search ............... 432/253, 258, 259, 261, 432/241

[56] References Cited

U.S. PATENT DOCUMENTS

| 687,508 | 11/1901 | Walker | 432/253 |
|---|---|---|---|
| 3,183,131 | 5/1965 | Huffman | 148/189 |
| 3,473,510 | 10/1969 | Sheng et al. | 118/719 |
| 3,604,494 | 9/1971 | Muller | 432/253 |
| 3,705,714 | 12/1972 | Alliegro | 432/241 |
| 3,744,650 | 7/1973 | Henebry | 220/4 E |
| 3,951,587 | 4/1976 | Alliegro et al. | 432/253 |
| 4,075,972 | 2/1978 | Yamawaki et al. | 432/253 |

Primary Examiner—John J. Camby
Attorney, Agent, or Firm—Birgit E. Morris; D. S. Cohen; Joseph D. Lazar

[57] ABSTRACT

A furnace paddle adapted to hold semiconductor wafers therein and having means attached thereto for supporting the paddle for movement along the inside of a cylindrically-shaped tube of a semiconductor processing furnace has means attached to the paddle adjacent the supporting means for limiting the lateral movement of the supporting means up the inside wall of the tube. The means includes a guide wing having two ends for contacting respectively the inside wall of the tube at intersecting points of a chord thereof and having a stem attached to the paddle adjacent the supporting means for maintaining the ends proximate the inside wall of the tube.

9 Claims, 3 Drawing Figures

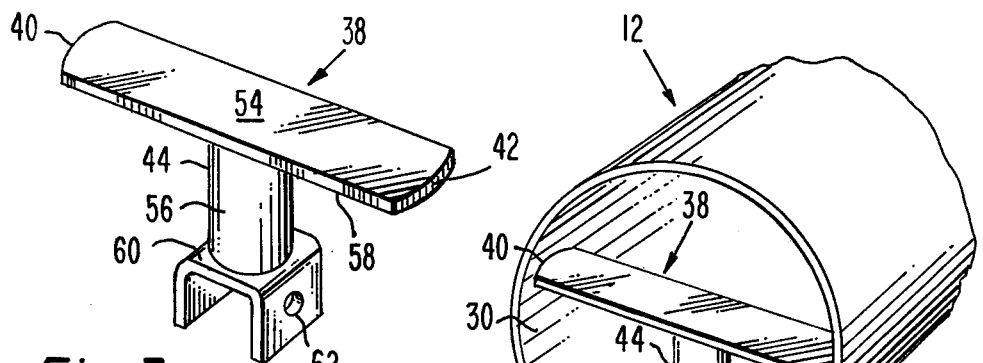
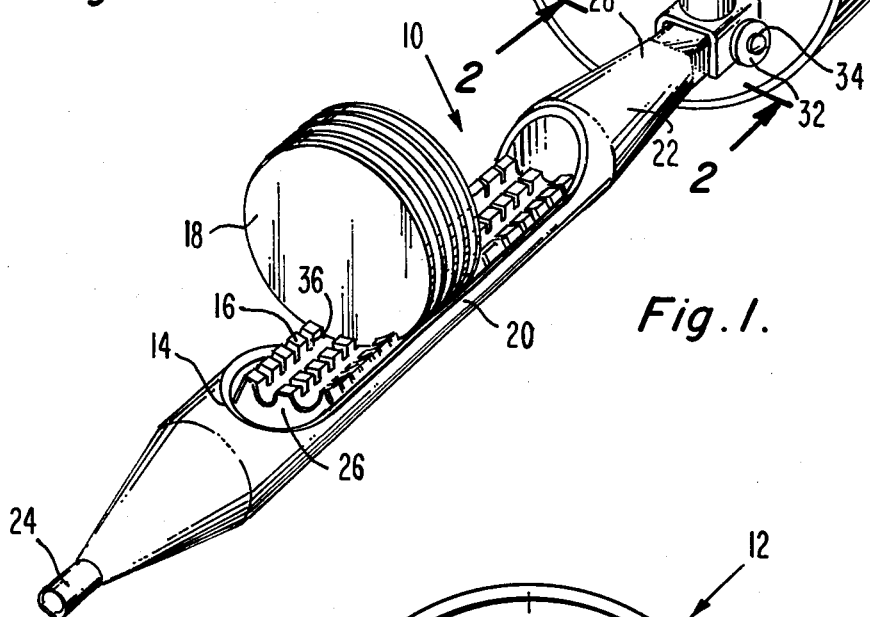
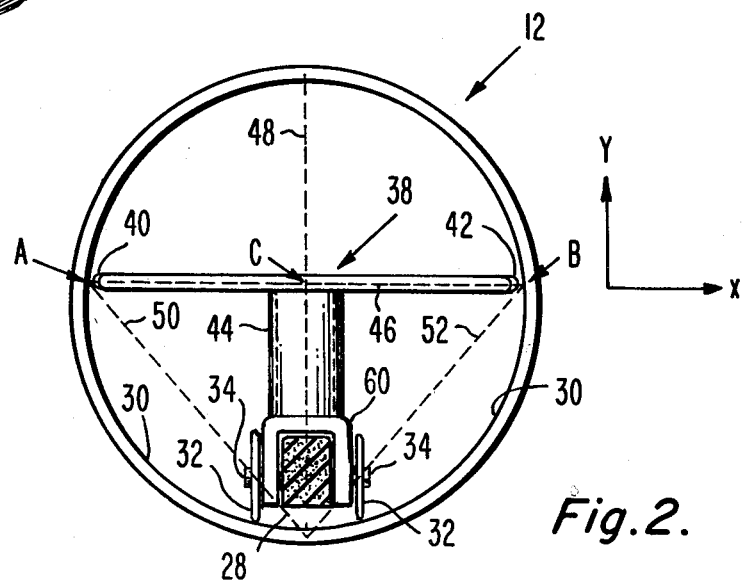

GUIDE WING FOR A FURNACE PADDLE

This invention relates to a furnace paddle adapted to hold semiconductor wafers therein and having means attached thereto for supporting the paddle for movement along the inside of a cylindrically-shaped tube of a semiconductor processing furnace, such as a diffusion furnace.

In manufacturing semiconductor devices, semiconductor wafers are placed into high-temperature processing furnaces comprising relatively long cylindrically-shaped tubes. The doping process is typically performed in this manner wherein conductivity modifiers are diffused into the wafers through selectively-defined openings in masks formed adjacent the wafer surfaces. In order to transport the wafers into and out of the tubes, appropriately designed paddles are frequently utilized which traverse the tubes while minimizing the introduction of undesirable impurities into the furance atmosphere. Each paddle has means attached thereto for supporting the paddle for movement along the inside of the tube. Such supporting means typically comprises one or more wheels, or a skid, attached to the end of the paddle which enters the processing tube.

A problem associated with the paddle while traversing the tube is that the supporting means, i.e., the wheels or skid, tends to track up the inside of the tube during entry or exit. The wafers are held upright in a stack-like configuration, usually by slots in a boat which rests in a depression in the paddle. Consequently, when the supporting means tracks up the inside of the furnace tube, the tops of the wafers scrape the upper portion of the tube and are damaged by breakage or warpage, contributing to a significant economic loss. Warped wafers are not able to be held securely by a vacuum chuck and will spin off and break. Such wafers also scratch photomasks and result in a low yield due to poor resolution on the warped wafers during the photolithographic process. The present invention provides a practical and efficient way to reduce such breakage and warpage, and thereby achieve a significant savings in resources.

In the drawings:

FIG. 1 is a partial, perspective view illustrating one embodiment of the present novel invention attached to a furance paddle.

FIG. 2 is a cross-sectional view taken along 2—2 of FIG. 1.

FIG. 3 is a perspective view of the embodiment shown in FIG. 1 prior to being attached to the furnace paddle.

Referring to FIG. 1 of the drawings, there is shown a typical furnace paddle 10 having a size and shape that will allow the paddle 10 to traverse a cylindrically-shaped tube 12 of a semiconductor processing furnace. The paddle 10 may be fabricated by forming and machining a silicon carbide billet to the desired shape after a presinter heat treatment. The machining would also include cutting a depression 14 in the paddle 10 in which a semiconductor wafer boat 16 adapted to hold semiconductor wafers 18 is placed. Alternatively, the silicon carbide paddle 10 can be formed to the desired shape and size by slip casting. For example, the paddle 10 can be slip cast to the shape shown in FIG. 1, having hollow end portions 24 and 22 and a boat-carrying section 20. The paddle 10 also has means attached to one end 28 thereof which enters the tube 12 for supporting the paddle 10 for movement along the inside wall 30 of the tube 12. Such supporting means typically comprises a skid or a pair of wheels 32, as illustrated in FIG. 1. The wheels 32 are formed separately and assembled with the finished paddle 10 utilizing an axle and axle caps 34. The semiconductor wafer boat 16 may be fabricated in similar manner to have a multitude of slots 36 which hold the wafers 18 upright in a stack-like configuration, as shown in FIG. 1. A more detailed description of silicon carbide furnace paddles is contained in Alliegro et al., U.S. Pat. No. 3,951,587 which issued Apr. 20, 1976, the disclosure of which is incorporated herein by reference.

Attached to the paddle 10 adjacent to the supporting means, i.e., wheels 32 in the present example, is means for limiting the lateral tracking movement of the supporting means up the inside wall 30 of the tube 12. In the present embodiment the novel limiting means comprises a guide wing 38 having two ends 40 and 42 of a member 54 for contacting respectively the inside wall 30 of the tube at intersecting points of a chord thereof. The guide wing 38 also has a stem 44 attached to the paddle 10 adjacent the wheels 32 for maintaining the ends 40 and 42 proximate the inside wall 30 of the tube 12 in a manner such that the adjoining chord (46) intersects the diameter (48) meeting the area where the wheels 32 contact the tube 12. The chord referred to above is diagrammatically shown in FIG. 2 as dotted line 46 which intersects the side wall 30 of the cylindrical tube 12 at points A and B. Line 46 thus has a dimension equal to a chord of tube 12. Preferably line 46 extends along the longitudinal axis of elongated member 54. The diameter meeting the wall area where the wheels 32 contact the tube 12, shown as dotted line 48 in FIG. 2, intesects the chord 46 at point C. Diameter 48 is coincident with the longitudinal axis of stem 44 when the paddle 10 is moving only along the desired longitudinal path through the tube 12.

The geometrical language used in the foregoing paragraph is intended to specifically define the geometry of the structure of the novel means utilized for limiting the lateral tracking movement of the wheels 32 up the inside wall 30 of the tube 12. As the paddle 10 is pushed into the tube 12, the wheels 32 have a tendency to track tangentially up the inside wall 30 of the tube 12 by moving in a lateral and upward direction, for example, in the positive X-direction and positive Y-direction. When this happens, the end 42 of the guide wing 38 contacts the inside wall 30 of the tube 12 at point B, making it possible for the tube 12 to exert on the guide wing 38 a counteracting force having components in the negative X-direction and negative Y-direction at point B, and thereby prevent further lateral movement of the wheels 32. In order to prevent this lateral movement in both the positive and negative X-directions, it is necessary that the chord 46 extending through member 54 intersect the diameter 48 so that a counteracting force vector in both X-directions will be developed when the member 54 contacts the wall of tube 12.

In the preferred embodiment, the chord 46 extending through member 54 and the two lines connecting the ends thereof with the area where the wheels 32 contact the tube 12, shown as dotted lines 50 and 52 in FIG. 2, form an acute triangle. An acute triangle is formed whenever the geometrical longitudinal center of the tube 12 lies within the triangular boundaries. The formation of such a triangle allows the chord 46 to lie above the geometrical center, so that a counteracting force vector exerted by the inside wall 30 of the tube 12 in the negative Y-direction at points A and B may be available to prevent further lateral movement. Whether or not such a counteracting force vector in the negative Y-direction is required will depend upon such factors as the magnitude of the downward force exerted by gravity on the paddle 10, the magnitude of the frictional force between the guide wing 38 and the tube 12 at the contact points, and the amount of lateral tracking movement of the wheels 32 which can be tolerated.

Utilizing the aforementioned geometrical guidelines, the novel guide wing 38 may comprise any shape or design including T-shape, Y-shape, or any combined configuration. In the present embodiment, the guide wing 38 is T-shaped wherein the chord 46 is substantially orthogonal to the diameter 48. As illustrated in FIG. 3, the two ends 40 and 42 comprise the ends of a substantially rectangular parallelepiped member 54, and the stem 44 comprises a hollow cylinder 56 having one base thereof attached to a surface 58 of the parallelepiped member 54. Preferably, the ends of the parallelepiped member 54 are slightly rounded in order to facilitate their movement adjacent to and prevent binding with the inside wall 30 of the tube 12 as the paddle 10 traverses the tube 12. In the present embodiment, the other base of the cylinder 56 is attached to a U-shaped yoke 60 adapted to fit over the one end 28 of the paddle 10. There is a hole 62 in each side of the yoke 60 through which the axle is inserted prior to assembling the wheels 32 and axle caps 34. This type of arrangement allows the guide wing 38 to be held in a relatively fixed position with respect to the paddle 10 and still be removable. Preferably, the three parts of the guide wing 38, i.e., the parallelepiped member 54, cylinder 56 and yoke 60, are constructed separately of either quartz or silicon carbide, and then fused together so as to minimize the introduction of impurities.

The novel guide wing 38 provides relatively simple means for limiting the lateral movement of the paddle wheels 32 as they move along the inside wall 30 of the tube 12. The guide wing 38 is a practical and efficient way to eliminate warpage caused by the semiconductor wafers 18 scraping the inside wall 30. Such a guide wing costs only a few dollars to construct, but achieves estimated yearly savings in the thousands of dollars.

What is claimed is:

1. A furnace paddle having a size and shape that will allow the paddle to traverse a cylindrically-shaped tube of a semiconductor processing furnace, said paddle adapted to hold semiconductor wafers therein and having means attached thereto for supporting the paddle for movement along the inside of said tube, the improvement comprising means attached to said paddle adjacent said supporting means for limiting lateral tracking movement of said supporting means up the inside wall of said tube during longitudinal movement of the paddle within the tube.

2. A furance paddle as defined in claim 1 wherein said limiting means comprises an elongated member having its longitudinal dimension equal to a chord of said tube, said member having two ends for contacting respectively the inside wall of said tube at intersecting points of said chord and having a stem attached to said paddle adjacent said supporting means for maintaining said ends proximate the inside wall of said tube in a manner such that said member intersects the tube diameter meeting the area where said supporting means contacts said tube.

3. A furnace paddle as defined in claim 2 wherein the chord dimension of said member and the two lines connecting the ends of said member with the area where said supporting means contacts said tube form an acute triangle.

4. A furnace paddle as defined in claim 3 wherein the chord dimension of said member is substantially orthogonal to said tube diameter meeting the area where supporting means contact said tube.

5. A furnace paddle as defined in claim 4 wherein said two ends comprise respectively the ends of said member wherein said member is in the form of a substantially rectangular parallelpiped and said stem comprises a cylinder having one base thereof attached to a surface of said parallelepiped.

6. A furnace paddle as defined in claim 5 wherein said member is made of quartz.

7. A furnace paddle as defined in claim 5 wherein said member is made of silicon carbide.

8. A furance paddle as defined in claim 1 wherein said supporting means comprises one or more wheels.

9. A furnace paddle as defined in claim 1 wherein said supporting means comprises a skid.

* * * * *